(12) United States Patent
Petersen et al.

(10) Patent No.: US 9,366,395 B2
(45) Date of Patent: Jun. 14, 2016

(54) OPTICAL ELEMENT, OPTOELECTRONIC COMPONENT AND METHOD FOR THE PRODUCTION THEREOF

(75) Inventors: Kirstin Petersen, Regensburg (DE); Stephan Preuss, Bad Abbach (DE); Markus Pindl, Tegernhelm (DE); Markus Boss, Regensburg (DE); Martin Brandl, Kelheim (DE)

(73) Assignee: OSRAM Opto Semiconductors GmbH (DE)

( * ) Notice: Subject to any disclaimer, the term of this patent is extended or adjusted under 35 U.S.C. 154(b) by 270 days.

(21) Appl. No.: 14/119,711

(22) PCT Filed: May 23, 2012

(86) PCT No.: PCT/EP2012/059627
§ 371 (c)(1),
(2), (4) Date: Mar. 3, 2014

(87) PCT Pub. No.: WO2012/160107
PCT Pub. Date: Nov. 29, 2012

(65) Prior Publication Data
US 2014/0168988 A1    Jun. 19, 2014

(30) Foreign Application Priority Data
May 24, 2011 (DE) .......................... 10 2011 102 350

(51) Int. Cl.
*F21V 9/16* (2006.01)
*F21K 99/00* (2016.01)
(Continued)

(52) U.S. Cl.
CPC ................. *F21K 9/50* (2013.01); *B29C 43/021* (2013.01); *B29D 11/0073* (2013.01); *B29D 11/00807* (2013.01); *H01L 24/97* (2013.01);
(Continued)

(58) Field of Classification Search
CPC ................ B29C 43/003; B29C 43/021; B29C 2043/023; B29C 43/20; B29D 11/0073; B29D 11/00807; F21K 9/50; F21K 9/90; H01L 24/97; H01L 2933/0041; H01L 2933/009; H01L 33/50; H01L 33/58; H01L 2933/0091
See application file for complete search history.

(56) References Cited

U.S. PATENT DOCUMENTS 6,309,580 B1 * 10/2001 Chou ...................... B29C 33/60
216/44
2007/0012940 A1 * 1/2007 Suh ........................ H01L 33/507
257/99

(Continued)

FOREIGN PATENT DOCUMENTS

CN    101459163    6/2009
CN    102052578    5/2011
(Continued)

OTHER PUBLICATIONS

English translation of Notice of Reasons for Rejection of corresponding JP Application No. 2014-511859 dated Feb. 3, 2015.
(Continued)

*Primary Examiner* — Peggy Neils
(74) *Attorney, Agent, or Firm* — DLA Piper LLP (US)

(57) ABSTRACT

An optical element for light outcoupling and/or conversion of light includes a light-emitting semiconductor chip with at least one layer selected from a wavelength conversion layer, a scattering layer, a light outcoupling layer and a lens layer, which each includes a plastics material processable in a compression molding method.

17 Claims, 10 Drawing Sheets

(51) Int. Cl.
  *H01L 33/50* (2010.01)
  *B29D 11/00* (2006.01)
  *B29C 43/02* (2006.01)
  *H01L 33/58* (2010.01)
  *H01L 23/00* (2006.01)
  H01L 25/075 (2006.01)
  B29C 43/20 (2006.01)

(52) U.S. Cl.
  CPC .............. *H01L 33/50* (2013.01); *H01L 33/505* (2013.01); *H01L 33/507* (2013.01); *H01L 33/58* (2013.01); *B29C 43/20* (2013.01); *H01L 25/0753* (2013.01); *H01L 2924/12036* (2013.01); *H01L 2924/12041* (2013.01); *H01L 2924/12042* (2013.01); *H01L 2924/15787* (2013.01); *H01L 2924/181* (2013.01); *H01L 2924/1815* (2013.01); *H01L 2933/0041* (2013.01); *H01L 2933/0058* (2013.01); *H01L 2933/0091* (2013.01)

(56) References Cited

U.S. PATENT DOCUMENTS

| | | | |
|---|---|---|---|
| 2008/0048200 A1* | 2/2008 | Mueller | B29C 41/14 257/98 |
| 2008/0169480 A1 | 7/2008 | Weng et al. | |
| 2008/0191225 A1* | 8/2008 | Medendorp | B29C 43/021 257/98 |
| 2009/0173957 A1 | 7/2009 | Brunner et al. | |
| 2010/0065864 A1* | 3/2010 | Kessels | G02F 1/133609 257/89 |
| 2010/0109025 A1* | 5/2010 | Bhat | H01L 24/97 257/88 |
| 2010/0244071 A1 | 9/2010 | Wada et al. | |
| 2011/0031516 A1* | 2/2011 | Basin | H01L 33/507 257/98 |
| 2014/0106487 A1 | 4/2014 | Fujioka et al. | |

FOREIGN PATENT DOCUMENTS

| | | |
|---|---|---|
| DE | 102008025756 | 12/2009 |
| EP | 0 911 144 | 4/1999 |
| EP | 2 312 625 | 4/2011 |
| JP | 2007-266356 | 10/2007 |
| JP | 2011-077491 | 4/2011 |
| JP | 2011-82340 | 4/2011 |
| WO | 2010/023992 | 3/2010 |
| WO | 2010/052621 | 5/2010 |

OTHER PUBLICATIONS

English translation of the First Office Action dated Dec. 2, 2015 of corresponding Chinese Application No. 201280036828.1.

* cited by examiner

OPTICAL ELEMENT, OPTOELECTRONIC COMPONENT AND METHOD FOR THE PRODUCTION THEREOF

TECHNICAL FIELD

This disclosure relates to an optical element, an optoelectronic component and a method for the production thereof.

SUMMARY

We provide an optical element for light outcoupling and/or conversion of light including a light-emitting semiconductor chip with at least one layer selected from a wavelength conversion layer, a scattering layer, a light outcoupling layer and a lens layer, which each include a plastics material processable in a compression molding method.

We also provide an optoelectronic component including a carrier with at least one light-emitting semiconductor chip and the optical element. We further provide a method of producing the optical element, in which a first layer selected from a wavelength conversion layer, a scattering layer, a light outcoupling layer and a lens layer and a second layer are each produced by a compression molding method, including the first layer is produced in a first molding step; and in a second molding step, the second layer is molded onto the first layer.

Lastly, we provide a method of producing an optoelectronic component with the optical element, which is produced using the method, in which a first layer selected from a wavelength conversion layer, a scattering layer, a light outcoupling layer and a lens layer and a second layer are each produced by a compression molding method, wherein the first layer is produced in a first molding step, and in a second molding step, the second layer is molded onto the first layer, and with a carrier with at least one light-emitting semiconductor chip, which is joined together with the optical element.

BRIEF DESCRIPTION OF THE DRAWINGS

FIGS. 7A to 7E are schematic representations of a method of producing an optoelectronic component according to a further example.

FIGS. 8A to 8C are schematic representations of method steps of a method according to a further example.

DETAILED DESCRIPTION

Figure 1A:
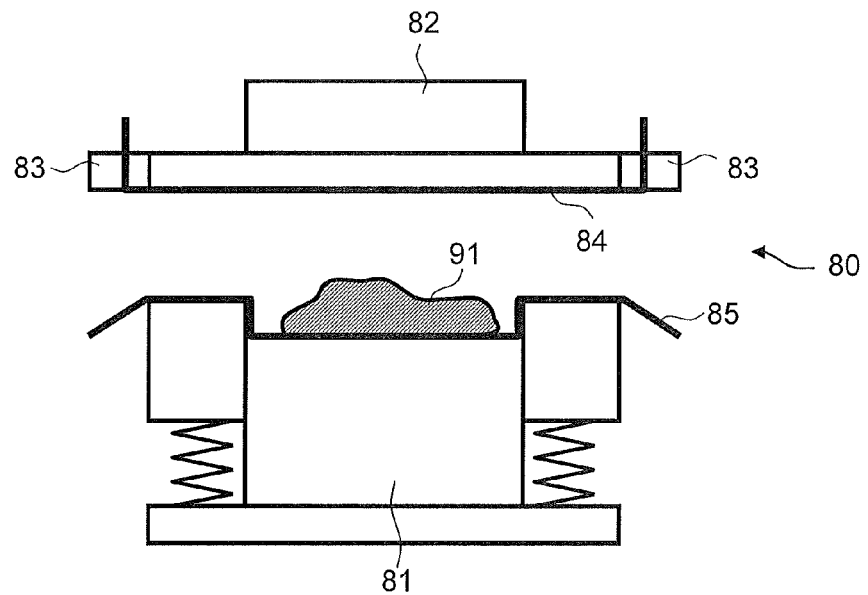
FIGS. 1A to 1D are schematic representations of method steps of producing an optical element according to one example.

We provide an optical element suitable for light refraction, light diffusion, light diffraction, wavelength conversion or a combination of one or more of the stated functions. For this purpose, the optical element may comprise a lens layer with one or more lenses, for example, in the form of an individual lens or a lens matrix or a lens array. Moreover, the optical element may comprise a plurality of materials with different refractive indices, for example, in the form of a scattering layer with a matrix material with embedded scattering particles or in the form of at least two layers with different refractive indices. Moreover, the optical element may comprise one or more wavelength conversion materials in the form of a wavelength conversion layer. Combinations of the above-stated features and/or layers are also possible. If the optical element comprises a plurality of layers, these are arranged on top of one another and preferably directly on top of one another or directly on top of one another at least in places.

The optical element may comprise at least one layer which is produced by a compression molding method. Moreover, the optical element may comprise a plurality of layers, which are produced by a compression molding method. Preferably, all the layers of the optical element may be produced by a compression molding method.

In a method of producing an optical element at least one layer may be produced by a compression molding method. To this end the at least one layer comprises a plastics material which is processable by a compression molding method.

In a method of producing the optical element, a first layer may be produced in a first method step by a compression molding method. In a further method step, a second layer may be molding onto the first layer by a compression molding method. The first and second layers may be formed by the above-stated layers. Moreover, more than two layers may also be molded onto one another by successive compression molding method steps.

All the layers of the optical element are particularly preferably each produced by a compression molding method, with the layers being molded onto one another in the case of a plurality of layers, preferably by successive compression molding method steps.

The features described below apply both to the optical element and to the method of producing the optical element.

An optical element may comprise a wavelength conversion layer and a scattering layer. The wavelength conversion layer and the scattering layer are arranged on top of one another. In particular, the wavelength conversion layer and the scattering layer may be arranged directly on top of one another or directly on top of one another at least in places.

The optical element may in this case be suitable in particular for light outcoupling and conversion of light which is emitted by a light-emitting semiconductor chip.

The wavelength conversion layer and the scattering layer each may comprise a plastics material processable by a compression molding method. The wavelength conversion layer and the scattering layer may in particular each preferably be produced by a compression molding method.

In a method of producing an optical element the wavelength conversion layer and the scattering layer may be produced as first and second layers of the optical element in each case by a compression molding method. This may mean in particular that in a first molding step the first layer is produced by a compression molding method, wherein the first layer may be selected from the wavelength conversion layer and scattering layer. In a second molding step, the second layer, accordingly selected from the wavelength conversion layer and scattering layer, is molded onto the first layer. This may mean in particular that, for example, in a first molding step the wavelength conversion layer is produced by a compression molding method. In the second molding step, the scattering layer is likewise produced by a compression molding method and in the process molded onto the wavelength conversion layer. It may alternatively also be possible to produce the scattering layer as the first layer in the first molding step, the wavelength conversion layer then being molded thereon in the second molding step as the second layer.

The optical element may comprise a lens layer with a lens or a plurality of lenses in the form of a lens matrix or a lens array. The plurality of lenses is here formed in a contiguous assembly as a lens layer by a compression molding method.

The optical element may comprise a first layer taking the form, as a lens layer, of one lens or a plurality of lenses, over which a second layer is molded. The first and second layers in this case have different refractive indices. In this way, the optical element may take the form of a "flat" lens or "planar" lens, in which the lens shape is formed at the boundary surface between the first and second layers and with which the side of the first and second layers remote from the boundary surface may in each case be of flat, i.e. planar, construction. As a result of the in refractive index at the lens-shaped boundary surface, refraction may be achieved. The previously described method may be applied accordingly to produce such an optical element.

The optical element may comprise a wavelength conversion layer and a lens layer or a flat lens molded onto one another. One of the layers is formed as the first layer according to the above-stated method by compression molding in a first compression molding method step and the further layer or the further layers are each molded in further method steps by compression molding in further compression molding method steps. A compression molding device with compression molding dies may be provided for the first molding step, in which the first layer is produced. If the optical element has just one layer, for example, a lens layer, the first layer produced as a lens layer may be demolded as the optical element.

If the optical element comprises at least one second layer in addition to the first layer, the second layer may be produced in a second molding step in the same compression molding device, the first layer forming part of a mold cavity of the compression molding die to produce the second layer and optionally a further compression molding die being used for specific shaping of the second layer compared to the first layer acting as a further part of the mold cavity.

In the first molding step, for example, a wavelength conversion layer may be produced as a first layer in the compression molding device. In the second molding step, a scattering layer may be produced in the same compression molding device as a second layer, the wavelength conversion layer forming part of the mold cavity of the compression molding die for production of the scattering layer. Moreover, in the first molding step a lens layer may be produced as the first layer, over which a second layer is molded in a second molding step in the form of a material with a different refractive index for forming a flat lens or in the form of a wavelength conversion layer. Alternatively, the respectively reverse production sequence is also possible.

By using the same compression molding device or the first layer as part of the mold cavity of the compression molding device, the second layer may be produced in a single step and bonded to the first layer by being molded thereon such that a defined multilayer structure is possible merely as a result of the molding steps of the compression molding method. By the compression molding method, the optical element may in this case be produced as a functional unit, for example, of a wavelength conversion layer, a scattering layer, a lens layer or a combination thereof.

The optical element may be molded onto a carrier film in the compression molding method. In the case, for example, of a multilayer optical element, the first layer may, for example, be molded onto the carrier film, which is provided in the compression molding device together with the material for the first layer. Once the single or multilayer optical element has been demolded, the carrier film may serve for further transport and further handling of the optical element. If the compression molding method is used to produce an assembly of a plurality of optical elements, the carrier film may also serve as a "separation film," on which the assembly may be singulated into the optical elements. Singulation may proceed, for example, using a method such as for instance sawing, scoring, breaking, punching and/or laser cutting or a combination thereof.

The carrier film may comprise polytetrafluoroethylene (PTFE), which may be advantageous, for example, because of its high processing stability.

The scattering layer may take the form of a reflector layer or a diffuser layer. This may mean in particular that the scattering layer comprises a plastics material, processed in a compression molding method, which comprises scattering particles in the form of diffuser or reflector particles.

In particular, the scattering particles may, for example, comprise a metal and/or a metal oxide, for instance titanium oxide ($TiO_2$) or aluminium oxide ($Al_2O_3$) such as for instance corundum and/or glass particles. The scattering particles may here have diameters or grain sizes of less than one micrometer up to an order of magnitude of 10 micrometers or even up to 50 micrometers. The scattering particles may, for example, have grain sizes or diameters of less than or equal to 10 μm and particularly preferably of less than or equal to 3 μm and moreover of greater than or equal to 300 nm.

As a result of the material, size and size distribution and the quantity and concentration of scattering particles in the scattering layer, the scattering and/or reflective properties of the scattering layer may be purposefully adjusted.

The wavelength conversion layer may comprise a plastics material processable using a compression molding method which contains a wavelength conversion material.

Moreover, the wavelength conversion layer may comprise one or more wavelength conversion materials, which are suitable for absorbing, at least in part, light of a particular spectrum, in particular light emitted by a light-emitting semiconductor chip, and for emitting it at an at least partially different wavelength range. The wavelength conversion material may, for example, comprise one or more of the following materials: materials comprising rare earths and/or alkaline earth metals, for example garnets of rare earths and of alkaline earth metals, for instance YAG:$Ce^{3+}$, nitrides, nitridosilicates, sions, sialons, aluminates, oxides, halophosphates, orthosilicates, sulfides, vanadates, chlorosilicates, oxynitrides and molybdates. Furthermore, the wavelength conversion material may additionally or alternatively comprise an organic material, which may be selected from a group comprising perylenes, benzopyrenes, coumarins, rhodamines and azo dyes. The wavelength conversion layer may comprise suitable mixtures and/or combinations of the stated wavelength conversion materials. This makes it possible, for example, for the wavelength conversion layer to absorb in an ultraviolet to blue wavelength range and to emit in a different wavelength range which comprises blue to red wavelengths or wavelength ranges, for example, green and red wavelengths or wavelength ranges or yellow wavelengths or wavelength ranges or a combination thereof or indeed blue, green, yellow and red wavelengths or wavelength ranges. By a wavelength conversion layer with such a wavelength conversion material which converts some of a blue light emitted by a semiconductor chip into yellow and/or green and red light, it is in particular possible to produce white light by superimposing unconverted light with converted light. Alternatively, other combinations of absorbed and emitted light are also possible for the wavelength conversion material. It may, for example, also be possible for all or virtually all of the light directed into the wavelength conversion layer to be converted. This is also known as "full conversion."

A lens layer and/or a scattering layer and/or a wavelength conversion layer comprise silicone or a silicone/epoxy hybrid material as the plastics material processable in a compression molding method, depending on whether the optical element may be of single- or multilayer construction. These materials are not only easy to process using compression molding methods but also offer high resistance to radiation and environmentally determined ageing. Silicone and silicone/epoxy hybrid materials may in particular be particularly radiation-resistant in relation to light emitted by light-emitting semiconductor chips. In a compression molding method, unlike in other forming methods, there is no sprue such that material may be saved in comparison thereto.

A flat lens may comprise a first layer and a second layer in each case with a silicone, wherein the silicone of the first layer and the silicone of the second layer have different refractive indices. The refractive index of a silicone depends in particular on the organic substituents $R^1$, $R^2$ and $R^3$ on the silicon atom and on the degree of branching of the silicone. Terminal groups of the silicone may be described as $R^1R^2R^3SiO_{1/2}$, linear groups as $R^1R^2SiO_{2/2}$ and branching groups as $R^1SiO_{3/2}$. $R^1$ and/or $R^2$ and/or $R^3$ may be selected independently on each silicon atom. $R^1$, $R^2$ and $R^3$ are in this case selected from a variety of organic substituents with different numbers of carbon atoms. The organic substituents may be at any desired ratio to one another in a silicone. As a rule, a substituent comprises 1 to 12, in particular 1 to 8, carbon atoms. $R^1$, $R^2$ and $R^3$ are selected, for example, from methyl, ethyl, cyclohexyl or phenyl, in particular methyl and phenyl. Moreover, the refractive indices may be adjusted by the formation of hybrid materials, for example silicone/epoxy.

At least one layer, for example, a lens layer, or a surface of the optical element formed by the layer may be vitrified. Vitrification may proceed, for example, by oxygen plasma ($O_2$ plasma).

A layer in the form of a scattering layer may comprise at least one recess in which a light-emitting semiconductor chip may be arranged. The recess is produced in particular during production of the scattering layer by the compression molding method. After production of the optical element, the recess is preferably arranged on a side of the scattering layer remote from a further layer, for example, from a wavelength conversion layer. In this way, the optical element may be arranged with the recess on or over a light-emitting semiconductor chip such that the latter is located inside the recess. Light emitted by the light-emitting semiconductor chip may be scattered and/or reflected by the scattering layer and in particular concentrated towards a further layer, preferably a wavelength conversion layer. Light converted by the wavelength conversion layer, which is emitted towards the light-emitting semiconductor chip and thus opposite to the desired emission direction, may be scattered and/or reflected by the scattering layer located between the light-emitting semiconductor chip and the wavelength conversion layer and thus concentrated towards the desired emission direction. Light losses caused by backscatter from the conversion layer towards the light-emitting semiconductor chip or onto a carrier on which the light-emitting semiconductor chip is arranged may thereby be avoided. The light emitted by the light-emitting semiconductor chip may moreover be homogenized by the scattering layer with regard to its emission pattern such that a non-homogeneous light distribution of the light emitted by the light-emitting semiconductor chip in the wavelength conversion layer may be avoided.

The at least one recess may be adapted with regard to its lateral dimensions, i.e. with regard to its cross section, to the lateral dimensions or cross-section respectively of the light-emitting semiconductor chip arranged in the recess. This may in particular mean that the recess is only slightly wider than the semiconductor chip and has the same cross-sectional shape as the semiconductor chip. In this way, the light-emitting semiconductor chip may be uniformly surrounded by the scattering layer at its side faces.

The optical element described here may advantageously ensure that, when compared to known measures designed to prevent backscatter towards the light-emitting semiconductor chip and/or a non-homogeneous light distribution in the wavelength conversion layer, it is possible to avoid scattering particle admixtures in the wavelength conversion layer and indeed a reflective potting compound in which the light-emitting semiconductor chip is conventionally potted up to the top edge of the chip and onto which the conversion layer is then applied. Production-related variations in such known measures may be avoided by the method described here, in particular a defined layer thickness and structure both of the scattering layer and the wavelength conversion layer may be achieved. Moreover, more homogeneous radiance may be achieved in the wavelength conversion layer and, consequently, a better brightness and color location distribution compared with known measures. Local radiation damage to the wavelength conversion layer due to high radiance over the chip, as may occur in known structures, may be avoided.

After production, the scattering layer may comprise a plurality of recesses in which a plurality of light-emitting semiconductor chips may be arranged. In other words, with the method described here an assembly of contiguous optical elements may be produced with the wavelength conversion layer and scattering layer with at least one recess. By singulating regions with at least one or more recesses in the scattering layer, it is possible to produce a plurality of optical elements.

The at least one recess in the scattering layer may project through the scattering layer. The recess may thus take the form of a through-hole or a through-opening through the scattering layer which extends from the side of the scattering layer remote from the wavelength conversion layer to the wavelength conversion layer. If a light-emitting semiconductor chip is arranged in the recess, the chip may emit light directly onto the wavelength conversion layer over the course of the recess. The recess particularly preferably takes the form not of a through-hole or a through-opening, but rather, for example, as a blind hole in the scattering layer. The recess here extends from the side of the scattering layer remote from the wavelength conversion layer through part of the scattering layer towards the wavelength conversion layer. By configuring the at least one recess not as a through-hole hole, it is possible to avoid direct emission of light from a light-emitting semiconductor chip arranged in the recess onto the wavelength conversion layer. In the region of the bottom of the recess adjoining the wavelength conversion layer, the scattering layer may be so thin that only little or virtually no light is reflected back by the scattering layer to the light-emitting semiconductor chip, with it being possible for light emitted towards the wavelength conversion layer to be homogenized with regard to its emission direction before it impinges on the wavelength conversion layer. This makes it possible to prevent an excessively high radiance being achieved at individual points of the wavelength conversion layer, while the radiance at other points of the wavelength conversion layer is lower, which might result in non-homogeneous radiance of the light output emitted by the wavelength conversion layer and thus by the optical element.

It is moreover also possible for the optical element to comprise another layer different from the scattering layer with a recess formed therein, for example, a lens layer or a wavelength conversion layer, the above-described features regarding the recess also applying in this case.

The optical element on a side of a wavelength conversion layer remote from the scattering layer may comprise at least one surface structure, in particular a three-dimensional surface structure. The surface structure may in particular be suitable to increase the light outcoupling from the wavelength conversion layer or the optical element. The surface structure may, for example, have lenticular and/or prismatic raised portions and/or recesses.

The surface structure may be formed by a surface of the wavelength conversion layer. This may mean in particular that the wavelength conversion layer is produced by the compression molding method with the surface structure on the side remote from the scattering layer.

The surface structure may be formed by a light outcoupling layer arranged on the side of the wavelength conversion layer remote from the scattering layer. The light outcoupling layer may in particular comprise a plastics material which is processable by a compression molding method. The light outcoupling layer may moreover preferably be transparent. In particular, the light outcoupling layer may comprise the same plastics material as the scattering layer and/or the wavelength conversion layer.

To produce an optical element with the wavelength conversion layer, the scattering layer and additionally a light outcoupling layer as first, second and third layers of the optical element, each of which being produced by a compression molding method, in a first molding step the wavelength conversion layer, the scattering layer or the light outcoupling layer may be produced as the first layer. The wavelength conversion layer may, for example, be produced as the first layer. In a second molding step, a second layer may be molded onto the first layer. If the wavelength conversion layer is produced as the first layer, in the second molding step the light outcoupling layer or the scattering layer may be molded onto the first layer as the second layer. In a third molding step, the remaining one of the three stated layers may be molded onto the first or second layer as the third layer. If the wavelength conversion layer was produced as the first layer and the light outcoupling layer as the second layer, the scattering layer may be molded onto the wavelength conversion layer on the side remote from the light outcoupling layer in the third molding step as the third layer.

Other sequences are alternatively also possible to produce the three layers.

The three layers may be produced in the same compression molding device, the first layer forming part of the mold cavity of a compression molding die of the compression molding device to produce the second layer and the first and second layers forming part of the mold cavity of a compression molding die of the compression molding device to produce the third layer. This makes it possible to produce the three layers successively each in one method step, adding them to a layer which has already been produced. The functional unit consisting of scattering layer, wavelength conversion layer and light outcoupling layer may thus be simply and economically produced with a defined multilayer structure using the compression molding method.

A transparent material may be arranged at least in a sub-region between the scattering layer and wavelength conversion layer. The transparent material may in particular be a plastics material processable using a compression molding method, for example, the same material as for the wavelength conversion layer and/or the scattering layer. In this way, it may be possible to form the scattering layer and the wavelength conversion layer with in each case a desired surface structure on the mutually facing surfaces, interspaces between the scattering layer and wavelength conversion layer being filled by the transparent material arranged therebetween.

In this case, on its side facing the wavelength conversion layer, the scattering layer may, for example, take the form of a reflector funnel filled at least in part with the transparent material such that the wavelength conversion layer, for example, in the form of a planar or curved layer, may be arranged over the scattering layer irrespective of the shape of the surface of the scattering layer.

An optoelectronic component may comprise an optical element according to one or more of the above-stated examples. The optoelectronic component further comprises a carrier.

The carrier may, for example, be a plastics or ceramic carrier with electrical conductor tracks. The carrier may, for example, take the form of a circuit board, for example, a Printed Circuit Board (PCB) or a "Metal Core Printed Circuit Board" (MCPCB). Moreover, the carrier may, for example, take the form of an "FR4 printed circuit board." Moreover, the carrier may also take the form of a ceramic substrate with conductor tracks and/or electrical vias. The carrier material may furthermore also comprise composite materials, for example, of copper and epoxide.

At least one light-emitting semiconductor chip may be arranged on the carrier. The carrier in particular provides a mounting region for the at least one light-emitting semiconductor chip such that the light-emitting semiconductor chip may be mounted on the carrier and electrically connected.

The carrier may in particular form a carrier, designated below as a planar carrier on which the light-emitting semiconductor chip is arranged. In this case, the optical element preferably comprises a recess as described above for the scattering layer, in which the at least one light-emitting semiconductor chip is arranged after mounting of the optical element on the carrier with the optoelectronic semiconductor chip.

Moreover, the carrier may also comprise a package or take the form of a package which comprises a recess, i.e. a cavity, in which the at least one light-emitting semiconductor chip is arranged. The package may, for example, comprise a plastics material in which electrical contact elements, for example, in the form of lead frame pieces, are embedded. The recess in the package may be filled with a transparent potting material, covering the at least one light-emitting semiconductor chip such that the package forms a planar surface with the potting compound, on which the optical element may be arranged and, for example, adhesively bonded.

The light-emitting semiconductor chip may be configured to emit light with a wavelength from the ultraviolet to infrared wavelength range and particularly preferably in a visible wavelength range when in operation. To this end, the light-emitting semiconductor chip may be based, for example, on an arsenide, phosphide or nitride compound semiconductor material and take the form of an epitaxially grown semiconductor layer sequence with an active region, for example, a pn-junction or a quantum well structure. Light-emitting semiconductor chip configurations are known and are therefore not explained in any further detail here.

The at least one light-emitting semiconductor chip may be arranged on a planar carrier in the above-described at least one recess in a scattering layer. In particular, the scattering layer may to this end be arranged directly on the carrier, adjacent to the light-emitting semiconductor chip. Thus, the light-emitting semiconductor chip may be surrounded by the scattering layer of the optical element such that as far as possible all the light emitted by the light-emitting semiconductor chip is emitted onto the scattering layer and/or in the direction of the wavelength conversion layer. The scattering particles contained in the scattering layer may in this way ensure homogenisation of the light output emitted by the light-emitting semiconductor chip. Moreover, unconverted light emitted directly from the light-emitting semiconductor chip can be prevented from exiting directly from the optoelectronic component. Such an effect is known in the case of known light-emitting diodes with wavelength conversion layers in which the wavelength conversion layer is applied directly to the light-emitting diode chip. Often such known light-emitting diodes are blue light-emitting diode chips with a wavelength conversion layer which converts at least part of the blue light into yellow light. Because with such known light-emitting diode chips the blue light may exit directly from the chip at the side edges, the light emitted by such known light-emitting diode chips often has a blue edge or outer region, which is also known as "blue piping" or a "blue ring." This effect may be advantageously prevented by the optical element described here in the case of the optoelectronic component described here.

With the scattering layer, it is possible in the described manner for the light emitted by the at least one light-emitting semiconductor chip to be advantageously homogenized such that the proportion of light emitted by the light-emitting semiconductor chip which is to be converted may be purposefully adjusted by the wavelength conversion layer. This makes it possible, in the case of the method described here for producing the optical element, straightforwardly to adjust the desired emission pattern of the optoelectronic component when producing the optical element.

A plurality of light-emitting semiconductor chips may be arranged on a planar carrier. Moreover, in this case the optical element comprises a plurality of recesses in the scattering layer such that the plurality of light-emitting semiconductor chips may be arranged in the plurality of recesses. In this way, the optoelectronic component may, for example, take the form of a light tile which, for example, comprises the light-emitting semiconductor chip in a matrix-like arrangement. Distributed over the surface of the planar carrier, the light-emitting semiconductor chips therefore emit light in a punctiform and thus non-homogeneous manner, it being possible for the light to be homogenized by the scattering layer of the optical element. The light emerging from the wavelength conversion layer of the optical element or optionally from the light outcoupling layer of the optical element which may be converted and optionally also partially unconverted, on the other hand has a uniform and homogeneous intensity distribution as a result of homogenisation by the scattering layer. This results in a uniformly light-emitting light tile.

In a method of producing the optoelectronic component the optical element may be produced in the above-described manner and joined together with a planar carrier with at least one light-emitting semiconductor chip such that the at least one light-emitting semiconductor chip is arranged in the at least one recess in the optical element. For example, to this end the optical element may be produced and completed as described above before being joined together with the carrier. The optical element may then be applied to the carrier with the at least one light-emitting semiconductor chip and, for example, adhesively bonded to the carrier.

Alternatively, it may also be possible, during production of the scattering layer, for the planar carrier with the at least one light-emitting semiconductor chip to form part of a mold cavity of a compression molding die or the compression molding device to produce the scattering layer. In this way it may be possible for the scattering layer to be molded on the carrier with the at least one light-emitting semiconductor chip. As a result, after molding onto the carrier with the at least one light-emitting semiconductor chip, the scattering layer comprises at least one recess, in which the light-emitting semiconductor chip is arranged and which is adapted in shape to the at least one light-emitting semiconductor chip. The scattering layer may in this case be molded in the first molding step onto the carrier as the first layer of the optical element, while the wavelength conversion layer is mounted onto the scattering layer in a subsequent second molding step. Alternatively, it may also be possible that, first, the wavelength conversion layer is produced in the compression molding device in a first molding step and forms part of the mold cavity of the compression molding device for a second molding step to produce the scattering layer. Another part of the mold cavity of the compression molding device is then formed by the carrier with the at least one light-emitting semiconductor chip, between which the scattering layer is then formed and molded in each case onto the scattering layer.

A planar carrier may comprise a plurality of light-emitting semiconductor chips. The carrier with the at least one light-emitting semiconductor chip, which is joined together with the optical element, may in a further method step be singulated after assembly into individual optoelectronic components with in each case at least one light-emitting semiconductor chip. Singulation may proceed, for example, using a method such as for instance sawing, scoring, breaking, punching and/or laser cutting or a combination thereof. Alternatively, it may also be possible for the optical element to be singulated prior to joining together with the carrier, as described further above.

A carrier formed as a package may comprise a plurality of light-emitting semiconductor chips, on which a common optical element is arranged. The carrier may, for example, further comprise a plurality of packages arranged together on a board and on which a common optical element is arranged.

The methods described here allow direct processing of the one or more layers produced of the optical element in the form of a matrix. The optical element may be produced with one or more layers with various optical functionalities in the same compression molding device by successive compression molding method steps. Moreover, a large number of light-emitting semiconductor chips may, for example, be combined in one process step with one or more optical elements. This makes production of a light tile possible, for example. Alternatively, through singulation, separation into individual optoelectronic components may be possible, wherein singulation may proceed directly on a carrier film. Moreover, simultaneous population of a plurality of carriers, in particular of packages, with a plurality of optical elements is possible, wherein no individual population process is needed, which may result in cost savings.

The methods described here also, for example, allow population of carriers, in particular of packages, with light-emitting semiconductor chips, onto which an optical element, for example, in the form of a lens or a lens array cannot be molded directly by "overmolding." Moreover, complex individual population, which is associated with high process costs, may be avoided.

Further advantages are revealed by the following examples described below in conjunction with the figures.

In the examples and figures, identical or identically acting constituents may in each case be provided with the same reference numerals. The elements illustrated and their size ratios to one another should not in principle be regarded as being to scale, but rather individual elements, such as for example layers, components, structural elements and regions, may have been made exaggeratedly thick or large to illustrate them better and/or to make them easier to understand.

FIGS. 1A to 1D show a method of producing an optical element 100 according to one example.

In a first method step according to FIG. 1A, a compression molding device 80 is provided, which comprises a lower compression molding die 81 and an upper compression molding die 82. A molding composition 91 comprising a plastics material processable in a compression molding method, in the example shown in particular silicone, is arranged in the lower compression molding die 81. To ease subsequent demolding, a demolding film 85 is also present on the lower compression molding die 81.

The upper compression molding die 82 comprises a supporting frame 83, which holds a carrier film 84. The optical element 100 produced by the method shown here is arranged on the carrier film 84 after production and may in this way be readily further processed. In particular, the carrier film 84 may comprise or consist of polytetrafluoroethylene (PTFE). The construction of the compression molding device 80 should be understood purely by way of example and may comprise further or alternative features, the structure and mode of operation of compression molding devices being known and therefore not explained further here.

Figure 1B:
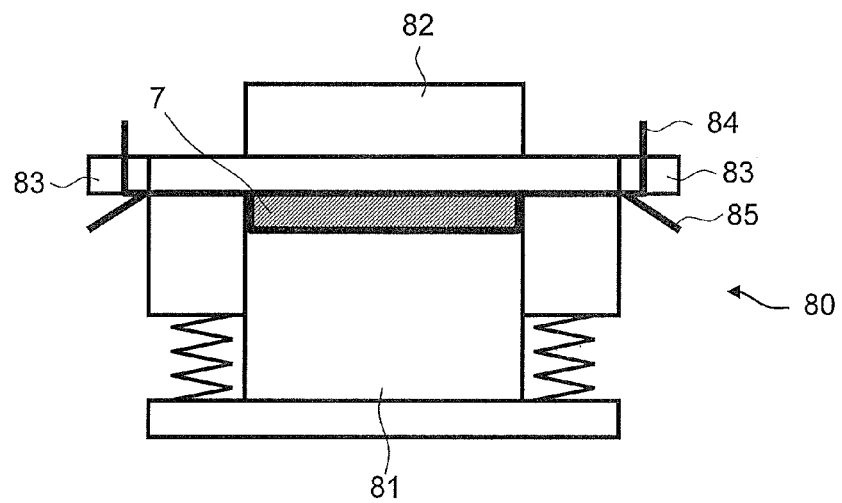

In a further method step according to FIG. 1B, a lens layer 7 is produced from the molding composition 91 by compression molding, i.e. bringing together and pressing together the lower and the upper compression molding dies 81, 82. Compression molding may be performed with simultaneous input of heat. For clarity's sake, FIG. 1B does not show surface structures in the lens layer 7.

As a result of the demolding film 85 in the lower compression molding die 81, the finished lens layer 7 may be easily removed from the lower compression molding die and remains arranged on the carrier film 84.

Moreover, the optical element 100 formed by the lens layer 7 may be vitrified. Vitrification may proceed, for example, by oxygen plasma ($O_2$ plasma).

Figure 1C:
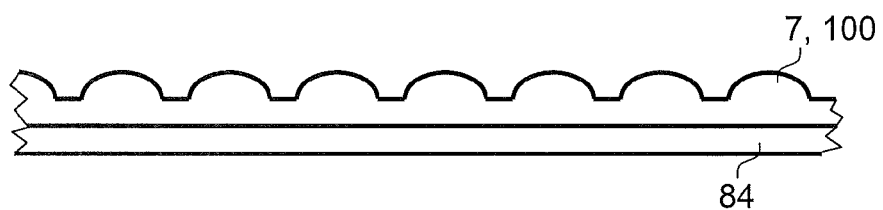
Figure 1D:
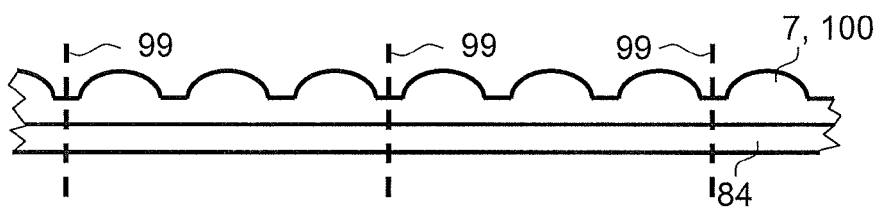

FIG. 1C shows a portion of the finished optical element 100 as a lens layer 7 on the carrier film 84. The lens layer 7 takes the form of a matrix of a plurality of lenses in an assembly, i.e. a "lens array". If the lens layer 7 needs to be subdivided into smaller units or individual lenses, this takes place in a further method step in the form of a singulation process along dividing lines 99, as indicated in FIG. 1D. Singulation may proceed, for example, by sawing, scoring, breaking, punching and/or laser cutting or a combination thereof and may be performed on the carrier film 84, in this case functioning as a separation film.

Figure 2A:
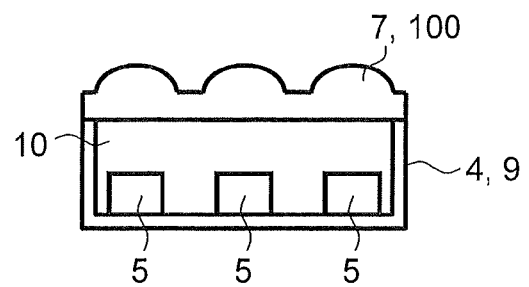
FIGS. 2A and 2B are schematic representations of optoelectronic components according to further examples.

FIG. 2A shows an example of an optoelectronic component 200, which comprises an optical element 100 in the form of a lens layer 7 according to the previous example.

The optical element 100 is arranged on a carrier 4 on which, in the example shown, a plurality of light-emitting semiconductor chips 5 are arranged. As an alternative to the illustrated plurality of light-emitting semiconductor chips 5 it is also possible for just one light-emitting semiconductor chip 5 or another number of light-emitting semiconductor chips 5 to be present.

The carrier 4 takes the form of a package 9 with a plastics material in which, for example, a lead frame (not shown) may be embedded to mount and electrically connect the light-emitting semiconductor chips 5. Electrical connection may take place, for example, by soldering and/or one or more bonding wires. The light-emitting semiconductor chips 5 are arranged in a recess, i.e. a cavity, in the package 9. The recess may, for example, be filled as in the example shown with a transparent potting material 10, for example, silicone, covering the light-emitting semiconductor chips 5 such that the package 9 forms a planar surface with the potting compound 10 on which the optical element 100 is arranged. The optical element 100 may be attached by adhesive bonding, for example.

The light-emitting semiconductor chips 5 may be of identical or different construction and comprise one of the compound semiconductor materials mentioned in the introductory part. In the example shown, the light-emitting semiconductor chips 5 may each contain a nitride or phosphide compound semiconductor material and may be intended to emit colored light when in operation, in particular blue, green, yellow or red light.

Figure 2B:
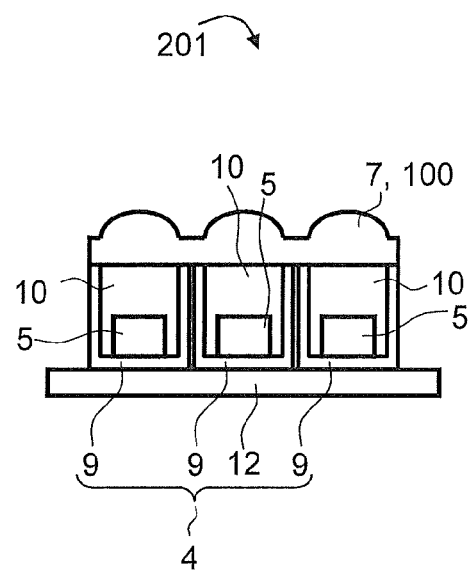

FIG. 2B shows a further example of an optoelectronic component 201 which, in contrast to the previous example, comprises a carrier 4 formed of a board 12 and a plurality of packages 9 applied and electrically connected thereto, which each comprise one light-emitting semiconductor chip 5. The optical element 100 forms a common optical element for the light-emitting semiconductor chips 5 and is arranged on the packages 9.

FIGS. 3A to 3D show a method of producing an optical element 101 according to a further example.

Unlike in the previous example, the optical element 101 comprises a wavelength conversion layer 1 and a scattering layer 2. The wavelength conversion layer 1 is produced in a first molding step according to FIG. 3A, as described in connection with FIGS. 1A and 1B, the first molding composition 91 comprising, in addition to a plastics material such as, for example, silicone, a wavelength conversion material according to an example described in the introductory part. After the first molding step, the wavelength conversion layer 1 thereby forms a first layer of the optical element 101, which is arranged on the carrier film 84.

Figure 3A:
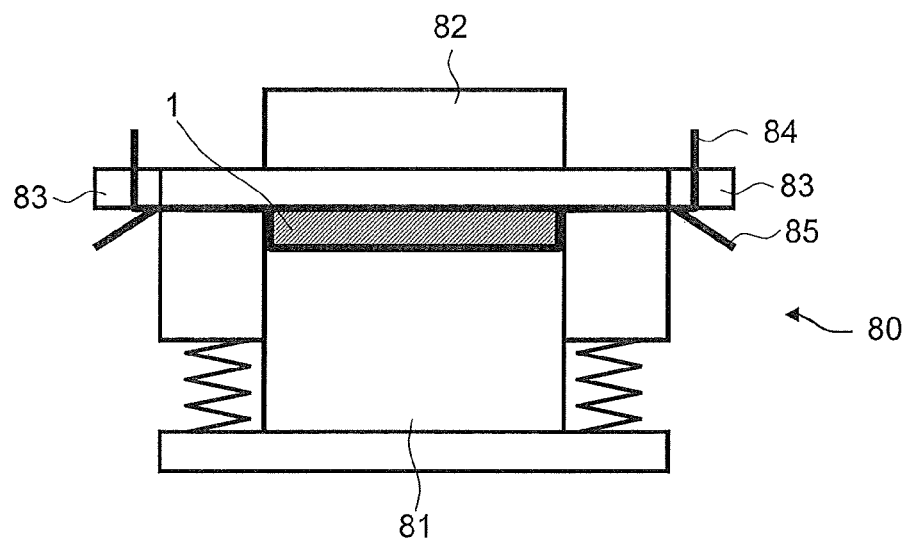
FIGS. 3A to 3D are schematic representations of method steps of a method according to a further example.
Figure 3B:
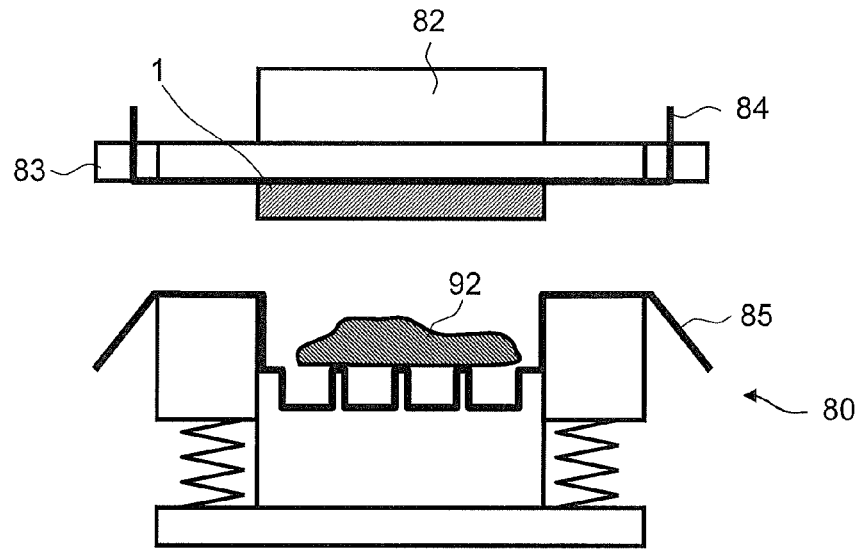

In a further method step according to FIG. 3B, the mold cavity of the lower compression molding die 81 is changed and a further molding composition 92 is arranged therein. The molding composition 92 likewise contains a plastics material deformable by a compression molding method, in the example shown silicone or a silicone/epoxide hybrid material, which contains scattering particles, i.e. diffuser and/or reflector particles according to the introductory part of the description. Moreover, a demolding film 85 is again arranged in the lower compression molding die 81.

Figure 3C:
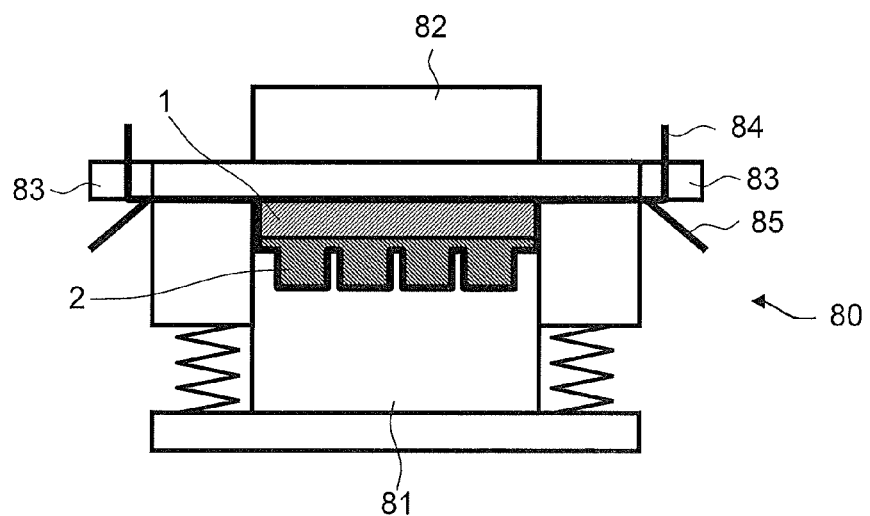

In a further method step according to FIG. 3C, the lower compression molding die 81 and the upper compression molding die 82 are again brought together, wherein now the wavelength conversion layer 1 which was produced as the first layer of the optical element 101, forms part of the mold cavity of the upper compression molding die 82 of the compression molding device 80. The second molding composition 92 is formed into the scattering layer 2 as the second layer of the optical element 100, wherein the second layer is molded onto the wavelength conversion layer 1 by the illustrated compression molding method step.

Figure 3D:
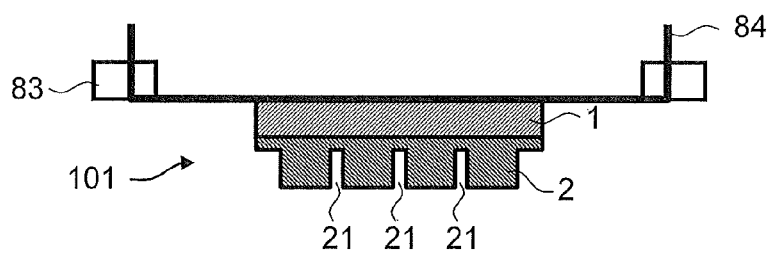

As a result of raised portions present in the lower compression molding die 81, recesses 21 are formed in the scattering layer 2 as shown in FIG. 3D. Once the lower and upper dies 81, 82 have been removed, the optical element 101 is arranged on the separation film 84 and the supporting frame 83 and comprises a plurality of recesses 21 in the scattering layer 2.

To produce the optical element 101, just two compression molding method steps are therefore necessary, in the same compression molding device 80. The optical element 101 may, as described further below, be arranged directly on a carrier with a plurality of light-emitting semiconductor chips. Alternatively, the optical element 101 may also, as described in relation to FIG. 1D, be singulated by separation into individual optical elements which, for example, each comprise one or more recesses 21.

In particular, the optical element 101 comprises the recesses 21 in a matrix-like arrangement, whereby a large number of light-emitting semiconductor chips may be encapsulated with the optical element 101 or optionally appropriately singulated parts of the optical element 101.

Figure 4A:
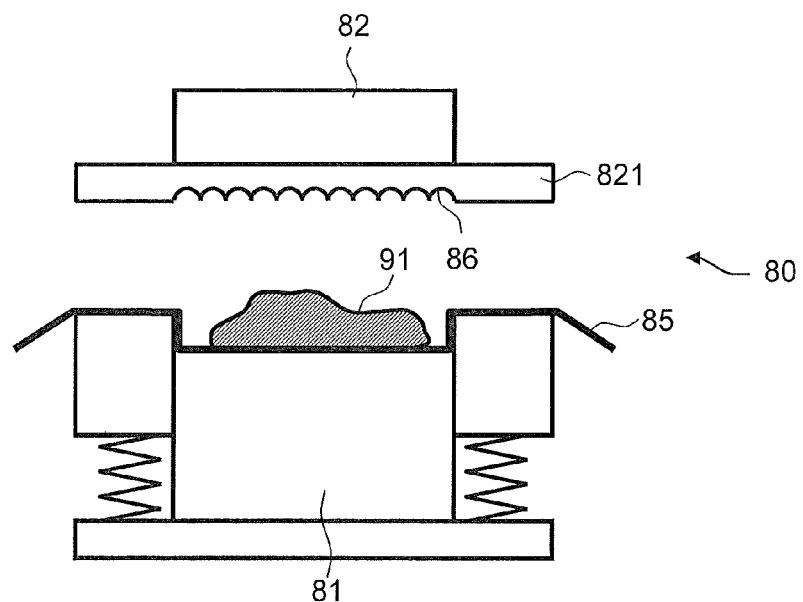
FIGS. 4A to 4C are schematic representations of method steps of a method according to a further example.
Figure 4B:
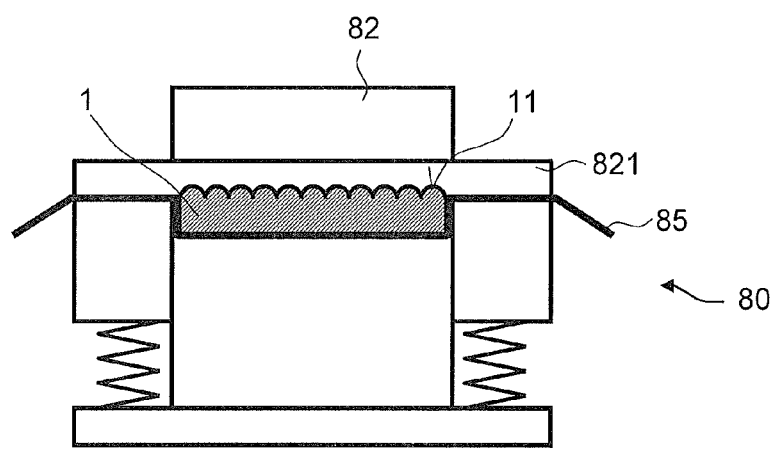
Figure 4C:
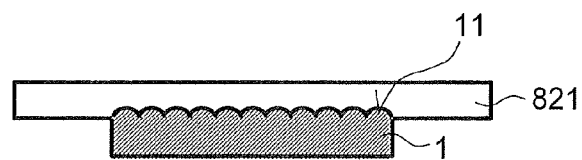

FIGS. 4A to 4C show method steps of a further method for the production of a wavelength conversion layer 1 for an optical element according to a further example.

In a first method step according to FIG. 4A, as in the previous example, a lower compression molding die 81 and an upper compression molding die 82 are provided as a compression molding device 80. In contrast to the previous example, the upper compression molding die 82 comprises a molding substrate 821, for example, in the form of a Teflon® plate, which comprises a negative structure 86 in the form of lenticular cavities.

As shown in FIG. 4B, it is thereby possible to produce a wavelength conversion layer 1 which has a three-dimensional surface structure 11 in the form of lenticular raised portions. The molding substrate 821 with the wavelength conversion layer 1 with the surface structure 11 may be removed from the compression molding device 80 or used again, as in the previous example, as part of the mold cavity for production of a scattering layer. The scattering layer may in particular be molded onto the wavelength conversion layer 1 as in the previous example.

The examples of FIGS. 5A to 6B show further multilayer optical elements which may be produced in a manner similar to the methods of the previously described examples.

Figure 5A:
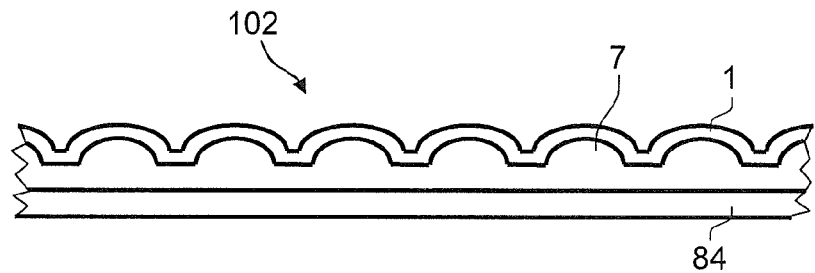
FIGS. 5A and 5B are schematic representations of an optical element and of an optoelectronic component according to further examples.

FIG. 5A shows an example of an optical element 102 on a carrier film 84 in which in a further compression molding method step a wavelength conversion layer 1 is molded as a second layer onto a lens layer 7 forming the first layer, the first layer having been formed by a clear translucent silicone layer and produced, for example, by the method of the example of FIGS. 1A to 1D.

Figure 5B:
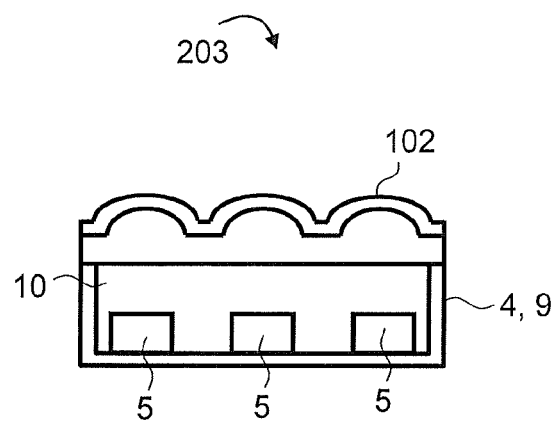

FIG. 5B shows an example of an optoelectronic component 203 which, as described in conjunction with FIG. 2A, comprises a carrier 4 configured as a package 9 with a plurality of light-emitting semiconductor chips 5 in a recess, wherein an optical element 102 according to FIG. 5A has been applied to the carrier 4.

The light-emitting semiconductor chips 5 may be of identical or different construction and comprise one of the compound semiconductor materials mentioned in the introductory part. In the example shown, the light-emitting semiconductor chips 5 may, for example, comprise a nitride compound semiconductor material and may be intended to emit blue light when in operation.

The wavelength conversion layer 1 may comprise a wavelength conversion material which converts some of the light emitted by the light-emitting semiconductor chip 5 into light of another wavelength, for example, yellow and/or green and red light. It may thereby be possible for white light to be emitted by the optical element 102 through superposition of the converted light with unconverted light. Alternatively, other combinations of light-emitting semiconductor chip and wavelength conversion materials are also possible.

Figure 6A:
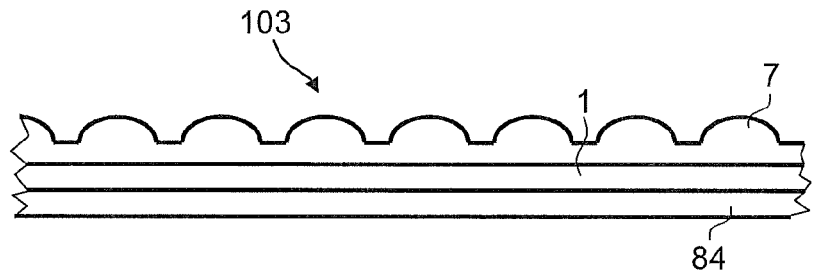
FIGS. 6A and 6B are schematic representations of optical elements according to further examples.

FIG. 6A shows an example of an optical element 103 on a carrier film 84 in which a lens layer 7 is molded as a second layer onto a wavelength conversion layer 1 constituting the first layer.

Figure 6B:
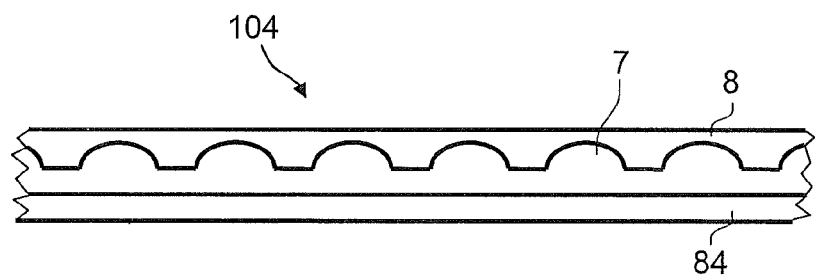

FIG. 6B shows an example of an optical element 104 on a carrier layer 84 in which a second layer 8 of a transparent material is arranged on a lens layer 7 forming the first layer and the lens layer 7 and the second layer 8 have different refractive indices. In particular, the lens layer may, for example, comprise a "silicone" which, as described in the introductory part, has a higher refractive index than a silicone of the second layer 8. The side of the second layer 8 remote from the lens layer 7 is of planar configuration such that the optical element 104 takes the form of a "flat," "planar" or gradient-index lens, in which refraction is brought about by the in refractive index at the boundary surface between the lens layer 7 and second layer 8.

If the optical elements shown in FIGS. 1C, 5A, 6A and 6B are to be arranged on a carrier 4 configured as a planar carrier instead of a package 9, as is described in relation to the following examples, recesses 21 may be provided in the optical elements in accordance with the following description and the description of the method of FIGS. 3A to 3D, for the arrangement of light-emitting semiconductor chips 5 formed by compression molding. Moreover, the optical elements shown in FIGS. 1C, 5A, 6A and 6B may also comprise a scattering layer in addition or as an alternative to the illustrated layers.

Figure 7A:
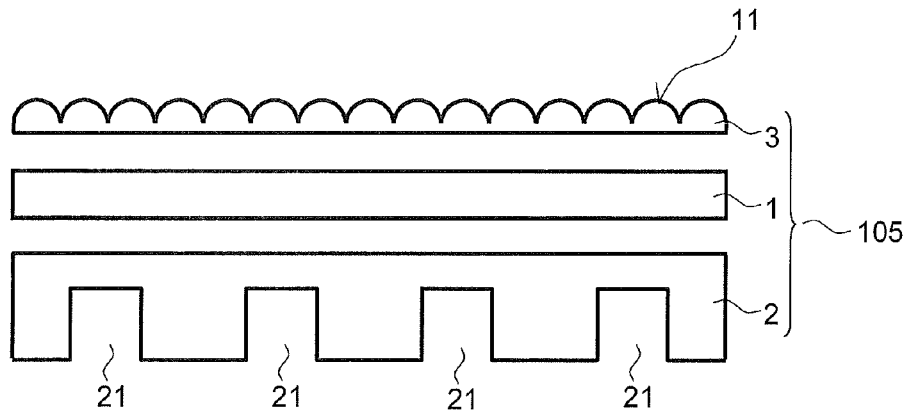
Figure 7B:
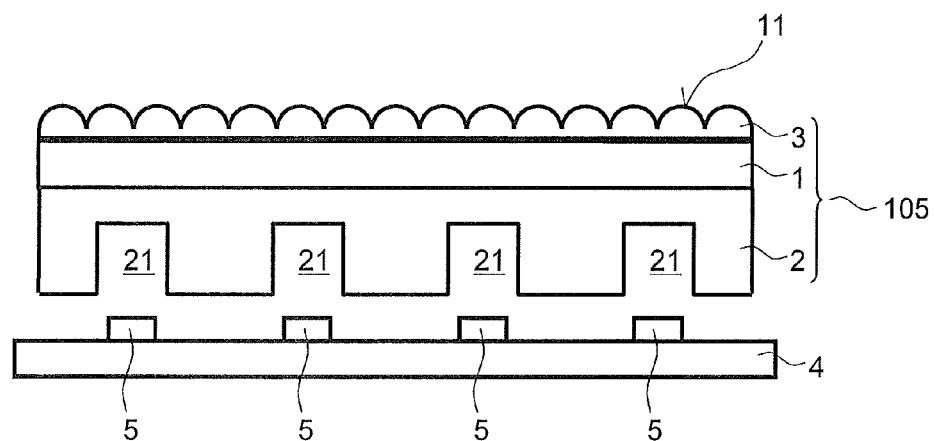
Figure 7C:
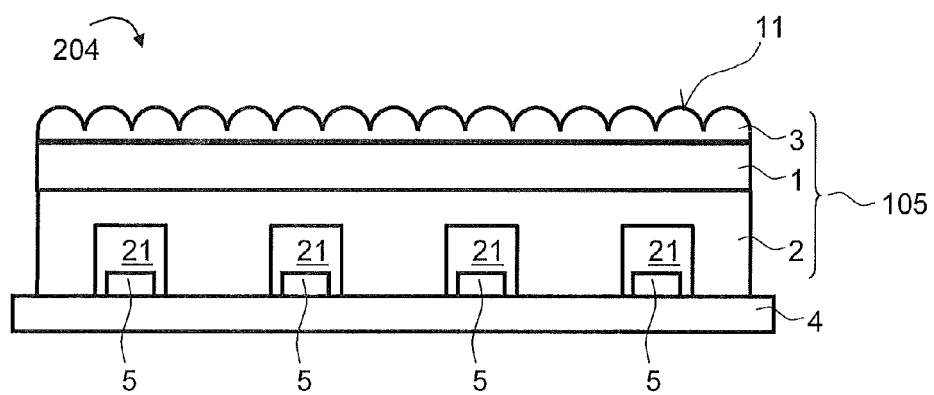

FIGS. 7A to 7C show a method of producing an optoelectronic component 204 according to a further example.

FIG. 7A is a schematic representation of the wavelength conversion layer 1 and the scattering layer 2 with the recesses 21 according to the example of FIGS. 3A to 3D. Moreover, a light outcoupling layer 3 is provided which consists of a transparent plastics material such as for instance silicone, processable using a compression molding method and comprises a surface structure 11 in the form of lenticular raised portions. It is also alternatively or additionally possible to provide prismatic raised portions, for example. In contrast to a lens layer 7, as described in relation to FIGS. 1A to 1D, 2A, 2B and 5A to 6B, the lenticular raised portions of the light outcoupling layer 3 are not designed to shape a beam of light emitted by a light-emitting semiconductor chip 5, but rather are intended to improve homogeneity of emission by randomization of the light paths coupled out from the light outcoupling layer 3.

The layers 1, 2 and 3 shown in exploded representation in FIG. 7A are produced and molded onto one another, as shown in FIGS. 3A to 3D, by successive compression molding methods. The light outcoupling layer 3 may be configured, for example, as shown in FIGS. 4A to 4C for the wavelength conversion layer 1. In particular, the wavelength conversion layer 1 and the scattering layer 2 are produced and molded onto one another according to the example of FIGS. 3A to 3D. In a further method step, the light outcoupling layer 3 may be produced by providing a further, transparent molding composition in the same molding die as the wavelength conversion layer 1 and the scattering layer 2, the wavelength conversion layer 1 and the scattering layer 2 forming part of the mold cavity of the molding die. In this way, the light outcoupling layer 3 may be formed on the side of the wavelength conversion layer 1 remote from the scattering layer 2 and molded onto the wavelength conversion layer 1.

In a further method step according to FIG. 7B, the optical element 105 produced in this way is arranged on a carrier 4 having a plurality of light-emitting semiconductor chips 5 and joined together therewith. The carrier 4 takes the form of a planar carrier and may be a printed circuit board or a ceramic carrier, for example, in which conductor tracks and/or electrical vias are provided. With these, the light-emitting semiconductor chips 5 are mounted on the carrier 4 and electrically connected.

The light-emitting semiconductor chips 5 may be of identical or different construction and comprise one of the compound semiconductor materials mentioned in the introductory part. In the example shown, the light-emitting semiconductor chips may, for example, comprise a nitride compound semiconductor material and may be intended to emit blue light when in operation. The wavelength conversion layer 1 may comprise a wavelength conversion material which converts some of the light emitted by the light-emitting semiconductor chip 5 into light of another wavelength, for example, yellow and/or green and red light. It may thereby be possible for white light to be emitted by the optical element 105 through superposition of the converted light with unconverted light. Instead of the individual semiconductor chips 5 illustrated here in the example shown and also in the subsequent examples, it is also possible for in each case two or more semiconductor chips to be arranged as light units, for example, emitting different colored light, for instance red and blue light. The wavelength conversion material of the wavelength conversion layer 1 may then preferably convert some of, for example, the blue light into yellow light. Alternatively, other combinations of light-emitting semiconductor chip and wavelength conversion materials are also possible.

In the example shown, the carrier 4 is joined to the optical element 105 by adhesive bonding. In this way, as shown in FIG. 7C, the optoelectronic component 204 is produced in which the light-emitting semiconductor chips 5 are each arranged in a recess 21 in the scattering layer 2 of the optical element 105. Light emitted by the light-emitting semiconductor chips 5 is scattered at the scattering layer 2 and homogenized in the direction of the wavelength conversion layer 1. In this way, uniform and homogeneous radiance may be achieved in the wavelength conversion layer 1 whereby, for example, local radiation damage caused by excessively high radiance in the wavelength conversion layer 1 may be avoided. Moreover, uniform conversion of the light emitted by the light-emitting semiconductor chips 5 may be achieved.

Light converted in the wavelength conversion layer 1 which is emitted towards the carrier 4 and which could possibly be absorbed by the carrier 4, is scattered and/or reflected by the scattering layer 2, and may be concentrated thereby in the direction of the light outcoupling layer 3. This prevents light from being lost through backscatter towards the carrier 4. Moreover, additional homogenization of light distribution in the wavelength conversion layer 1 and in particular also in the light outcoupling layer 3 may consequently be achieved.

As a result of the surface structure 11 of the light outcoupling layer 3, emission of the converted and unconverted light may additionally be modified with regard to the desired emission pattern and for example further homogenized.

The optoelectronic component 204 in the example shown takes the form of a light tile which may, for example, emit white light with a homogeneous light-emitting surface.

Figure 8A:
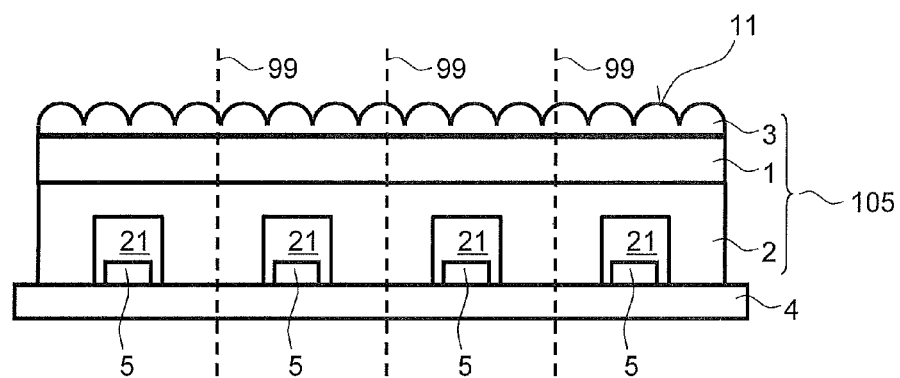
Figure 8B:
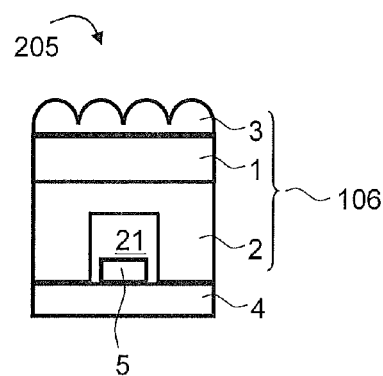

In conjunction with FIGS. 8A and 8B, further method steps according to a further example are shown, by which the carrier 4 with the plurality of light-emitting semiconductor chips 5 and the optical element 105 of the previous example may be further processed into individual optoelectronic components 205.

To this end, as shown in FIG. 8A, the carrier 4 with the optical element 105 arranged thereon is singulated along dividing lines 99. Singulation may, for example, proceed by sawing, scoring, breaking, punching, laser cutting or a combinations thereof. As shown FIG. 8B, individual optoelectronic components 205 may thereby be produced which, for example, each comprise one light-emitting semiconductor chip 5 in a recess 21 in an optical element 106 formed by the singulation.

By joining the carrier 4 with a plurality of light-emitting semiconductor chips 5 with the optical element with a corresponding plurality of recesses 21 and subsequent singulation along the dividing lines 99, a large number of optoelectronic components 205 can be obtained with just a few process steps.

FIGS. 9A to 9D show further examples of optoelectronic components 206 to 209. In these examples, unlike the method according to FIGS. 7A to 7C, the carrier 4 with the plurality of light-emitting semiconductor chips 5 is used as part of the mold cavity of the compression molding die with which the scattering layer 2 is produced. In this way, the scattering layer 2 may be molded directly onto the carrier 4 by the compression molding method, whereby in each of the regions of the carrier 4 in which a light-emitting semiconductor chip 5 is arranged a recess 21 is formed, which is adapted to the shape of the respective light-emitting semiconductor chip 5. The further layers of the illustrated optical elements 107 to 110 may be produced or molded on in previous or subsequent compression molding method steps.

The optoelectronic components 206 to 209 are here shown in each case as light tiles. However, as described in relation to FIGS. 8A and 8B, they may also be singulated into optoelectronic components with, for example, in each case just one light-emitting semiconductor chip 5.

Figure 9A:
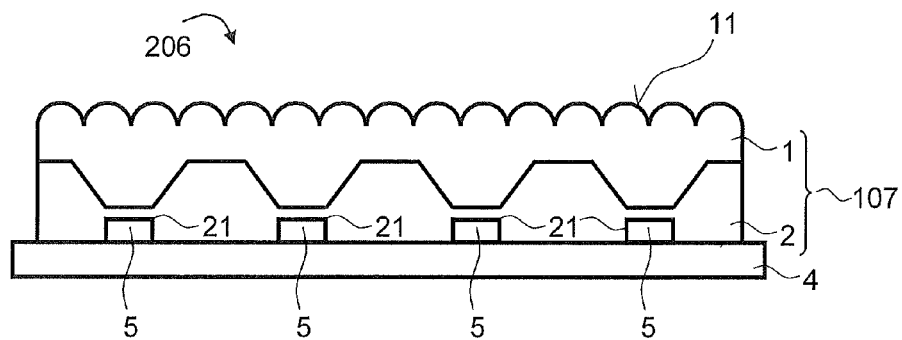
FIGS. 9A to 9D are schematic representations of optoelectronic components according to further examples.

The optoelectronic component 206 according to FIG. 9A comprises an optical element 107 with a scattering layer 2, which comprises reflector-like recesses. A wavelength conversion layer 1 is formed over the scattering layer 2 and the reflector-like recesses thereof, the wavelength conversion layer having on its top remote from the scattering layer 2 a surface structure 11 in the form of lenticular raised portions for enhancing light outcoupling.

Figure 9B:
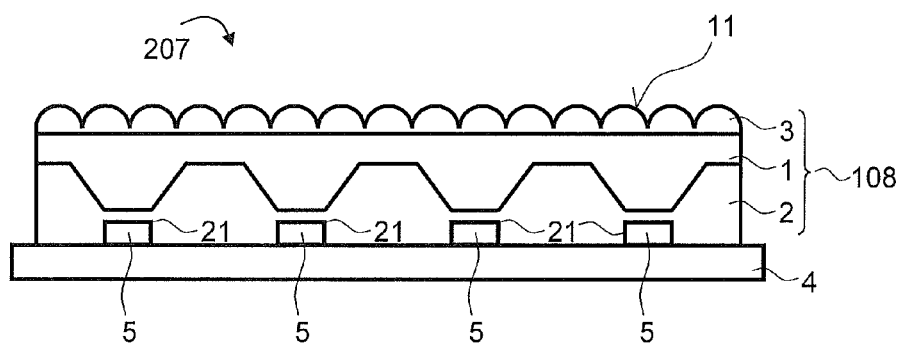

According to the example in FIG. 9B, an optoelectronic component 207 is shown which comprises an optical element 108 which, in contrast to the previous example, comprises a light outcoupling layer 3 with the surface structure on the top of the wavelength conversion layer 1 remote from the scattering layer 2.

Figure 9C:
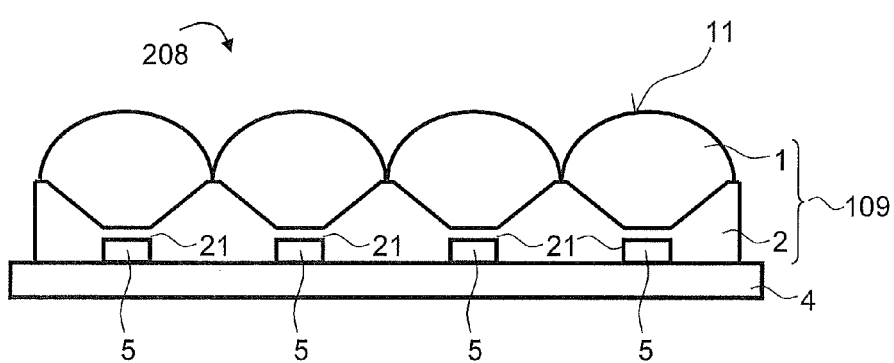

In the example according to FIG. 9C, an optoelectronic component 208 is shown which comprises an optical element 109 with a scattering layer 2 and a wavelength conversion layer 1, the wavelength conversion layer 1 comprising a structure 11 in the form of lenticular raised portions. Each lenticular raised portion is arranged over a reflector-like recess in the scattering layer 2.

Figure 9D:
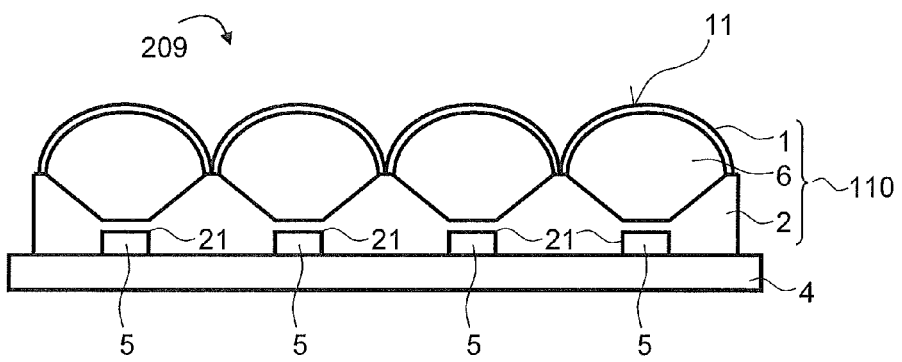
Figure 10A:
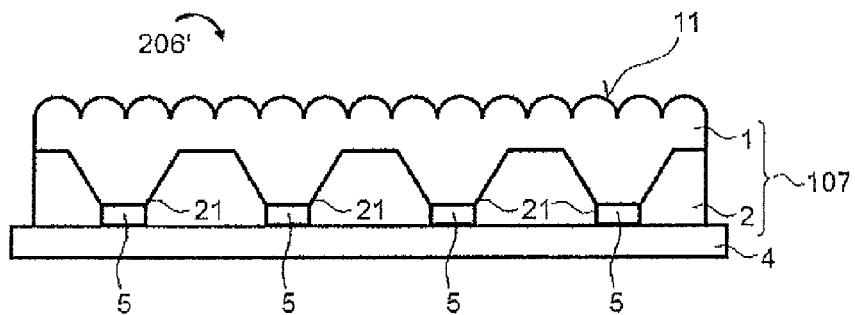
FIGS. 10A to 10D are schematic representations of optoelectronic components according to further examples similar to those shown in FIGS. 9A to 9D, respectively.
Figure 10B:
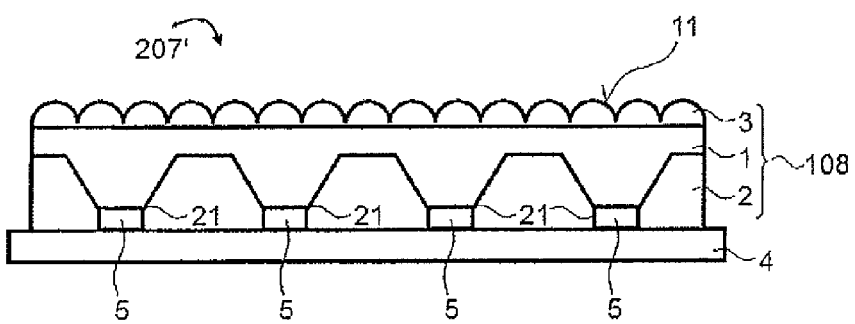
Figure 10C:
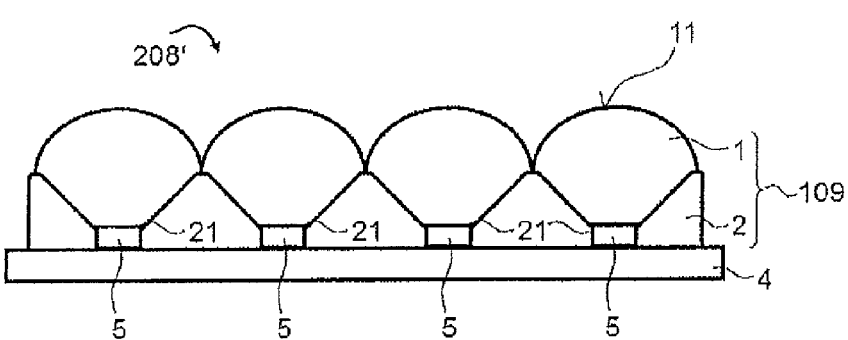
Figure 10D:
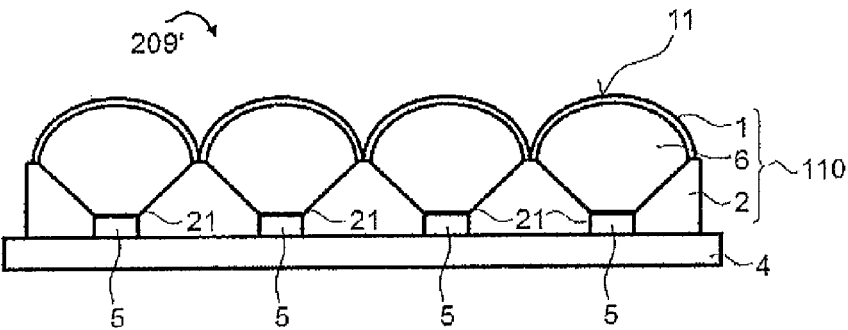

In the example according to FIG. 9D, an optoelectronic component 209 with an optical element 110 is shown which comprises a transparent material 6 between the wavelength conversion layer 1 and the scattering layer 2. The transparent material 6 is here likewise produced by a compression molding method and comprises the same shape as the wavelength conversion layer 1 in the example according to FIG. 9C. On the other hand, the wavelength conversion layer 1 in the example according to FIG. 9D takes the form merely of a thin layer on the transparent material 6. It is thereby possible to adjust the wavelength conversion layer 1 precisely with regard to the quantity of light converted by the wavelength conversion layer 1. Moreover, the wavelength conversion layer 1 may be positioned evenly spaced from the respective light-emitting semiconductor chip 5, directly over which it is arranged.

With the method disclosed here, it is possible to produce defined layer thicknesses and structures for the wavelength conversion layer 1, the scattering layer 2, optionally the light outcoupling layer 3 and the lens layer 7 such that optoelectronic components may be produced which have a desired emission pattern, for example, a homogeneous radiance with regard to the emitted light.

Because the light-emitting semiconductor chips 5, for example, on planar carriers 4 may be enclosed by the recesses 21 in the scattering layer 2, the direct emission of unconverted light, for example, in lateral directions from the optoelectronic components may be avoided, thereby avoiding the known effect of "blue piping." The functional unit consisting of the optical element layers in the form of scattering layer, wavelength conversion layer, light outcoupling layer and/or lens layer may be simply produced by the multi-step compression molding method described here with a small number of method steps and a high level of reliability.

In the examples shown in FIGS. 10A to 10D, optoelectronic components 206', ..., 209' correspond to the optoelectronic components 206, ..., 209 of FIGS. 9A to 9D, respectively, but which have recesses in the scattering layer 2 formed as through-holes.

The examples shown in the figures may be combined together according to further examples. Moreover, the examples shown in the figures may have further or alternative features according to the introductory part of this description.

The description made with reference to examples does not restrict this disclosure to these examples. Rather, this disclosure encompasses any novel feature and any combination of features, including in particular any combination of features in the appended claims, even if the feature or combination is not itself explicitly indicated in the claims or examples.

The invention claimed is:

1. An optical element for light outcoupling and/or conversion of light comprising a light-emitting semiconductor chip with at least one layer selected from a wavelength conversion layer, a scattering layer, a light outcoupling layer and a lens layer, which each comprise a plastics material processable in a compression molding method,
   wherein the at least one layer comprises the wavelength conversion layer and the lens layer applied on top of one another,
   a transparent material is arranged at least in a sub-region between the scattering layer and wavelength conversion layer, and
   the scattering layer comprises at least one recess for arrangement of the light-emitting semiconductor chip, the at least one recess having the form of a through-opening through the scattering layer and extending from a side of the scattering layer remote from the wavelength conversion layer to the wavelength conversion layer.

2. The optical element according to claim 1, wherein the at least one layer comprises at least one recess for arrangement of the light-emitting semiconductor chip.

3. The optical element according to claim 1, wherein on a side of the wavelength conversion layer remote from the scattering layer, at least one surface structure is arranged.

4. The optical element according to claim 3, wherein the surface structure is formed by a surface of the wavelength conversion layer or by a light outcoupling layer.

5. The optical element according to claim 3, wherein the surface structure comprises lenticular and/or prismatic raised portions and/or recesses.

6. The optical element according to claim 1, wherein a wavelength conversion layer and a lens layer are applied on top of one another, and the wavelength conversion layer and the lens layer each comprise a plastics material processable in a compression molding method.

7. The optical element according to claim 1, further comprising a further layer applied on the lens layer and the further layer has a different refractive index.

8. An optoelectronic component comprising a carrier with the light-emitting semiconductor chip and the optical element according to claim 1.

9. The optoelectronic component according to claim 8 with the optical element, wherein the at least one layer comprises at least one recess for arrangement of the light-emitting semiconductor chip and wherein the wavelength conversion layer and scattering layer are applied on top of one another, and the wavelength conversion layer and the scattering layer each comprise a plastics material processable in a compression molding method and the scattering layer comprises the at least one recess for arrangement of the light-emitting semiconductor chip and the at least one light-emitting semiconductor chip is arranged in the at least one recess.

10. The optoelectronic component according to claim 9, wherein a plurality of light-emitting semiconductor chips are arranged on the carrier and each of the plurality of light-emitting semiconductor chips is arranged in a recess in a scattering layer of the optical element.

11. The optoelectronic component according to claim 8, wherein the carrier comprises at least one package with a recess in which the at least one light-emitting semiconductor chip is arranged, and in which a potting compound is arranged which covers the light-emitting semiconductor chip such that the package and potting compound form a planar face on which the optical element is arranged.

12. A method of producing the optical element according to claim 1, in which a first layer selected from the wavelength conversion layer, the scattering layer, the light outcoupling layer and the lens layer and a second layer are each produced by a compression molding method, wherein
   the first layer is produced in a first molding step; and
   in a second molding step, the second layer is molded onto the first layer.

13. The method according to claim 12, in which the first layer is produced in the first molding step in a compression molding device and the second layer is produced in the second molding step in the same compression molding device, wherein the first layer forms part of a mold cavity for production of the second layer.

14. The method according to claim 12, in which a wavelength conversion layer, a scattering layer and a light outcoupling layer are each produced by a compression molding method as the first, second and third layers, wherein
   in a first molding step, the first layer produced is selected from the wavelength conversion layer, the scattering layer and the light outcoupling layer;
   in a second molding step, the second layer is molded onto the first layer; and
   in a third molding step the third layer is molded onto the first or second layer.

15. A method of producing an optoelectronic component with the optical element according to claim 1, which is produced using a method in which a first layer selected from a wavelength conversion layer, a scattering layer, a light outcoupling layer and a lens layer and a second layer are each produced by a compression molding method, wherein
   the first layer is produced in a first molding step; and
   in a second molding step, the second layer is molded onto the first layer;
   with a carrier with at least one light-emitting semiconductor chip, which is joined together with the optical element.

16. The method according to claim 15, in which the optical element is applied after production to the carrier with the at least one light-emitting semiconductor chip.

17. The method according to claim 15, in which the carrier comprises a plurality of light-emitting semiconductor chips and the carrier with the optical element is singulated after assembly into individual optoelectronic components with, in each case, at least one light-emitting semiconductor chip.

* * * * *